(12) United States Patent
Wang et al.

(10) Patent No.: US 10,026,221 B2
(45) Date of Patent: Jul. 17, 2018

(54) WETLAND MODELING AND PREDICTION

(71) Applicants: THE UNIVERSITY OF NORTH CAROLINA AT CHARLOTTE, Charlotte, NC (US); NORTH CAROLINA DEPARTMENT OF TRANSPORTATION, Raleigh, NC (US)

(72) Inventors: Sheng-Guo Wang, Charlotte, NC (US); Libin Bai, Charlotte, NC (US); Jing Deng, Charlotte, NC (US); Meijuan Jia, Charlotte, NC (US); Morgan Weatherford, Raleigh, NC (US); LeiLani Paugh, Louisburg, NC (US); Wenwu Tang, Charlotte, NC (US); Mingzhi Chen, Fuzhou (CN); Shen-En Chen, Charlotte, NC (US)

(73) Assignees: THE UNIVERSITY OF NORTH CAROLINA AT CHARLOTTE, Charlotte, NC (US); NORTH CAROLINA DEPARTMENT OF TRANSPORTATION, Raleigh, NC (US)

(*) Notice: Subject to any disclaimer, the term of this patent is extended or adjusted under 35 U.S.C. 154(b) by 409 days.

(21) Appl. No.: 14/724,787

(22) Filed: May 28, 2015

(65) Prior Publication Data
US 2015/0347673 A1    Dec. 3, 2015

Related U.S. Application Data

(60) Provisional application No. 62/003,887, filed on May 28, 2014, provisional application No. 62/003,869, filed on May 28, 2014.

(51) Int. Cl.
*G06G 7/48* (2006.01)
*G06T 17/05* (2011.01)
(Continued)

(52) U.S. Cl.
CPC .............. *G06T 17/05* (2013.01); *G01S 17/88* (2013.01); *G06F 17/5009* (2013.01); *G06K 9/0063* (2013.01); *G06Q 30/02* (2013.01)

(58) Field of Classification Search
CPC ............ G01F 23/0061; G06F 17/5009; G06F 17/30241; G06F 17/5018; G06Q 30/02;
(Continued)

(56) References Cited

U.S. PATENT DOCUMENTS 7,072,863 B1 * 7/2006 Phillips .................. G06Q 40/00
  703/2
9,229,133 B2 * 1/2016 Guha ...................... G01W 1/10
(Continued)

*Primary Examiner* — Kandasamy Thangavelu
(74) *Attorney, Agent, or Firm* — Oliff PLC; R. Brian Drozd

(57) ABSTRACT

Embodiments of the present application are directed to an automation process method to generate a set of wetland predictive variables using Light Detection and Ranging ("LiDAR") data within a geographic information system ("GIS") software platform, according to some embodiments, and to model and predict wetland in ArcGIS platform using the generated variable set. The automatic process also can run analysis on and display of the predicted wetland. The process is built by developing modules and connection in GIS. The above mentioned processes are automatically run and may just be run by one-button press, or on click, or separate buttons press, or separate clicks.

7 Claims, 28 Drawing Sheets

(51) Int. Cl.
*G06F 17/50* (2006.01)
*G06Q 30/02* (2012.01)
*G01S 17/88* (2006.01)
*G06K 9/00* (2006.01)

(58) Field of Classification Search
CPC .......... G06Q 10/04; G06Q 40/00; G01V 9/02; G06K 9/6269; E21B 49/00; H04L 41/145
See application file for complete search history.

(56) References Cited

U.S. PATENT DOCUMENTS

| | | | |
|---|---|---|---|
| 2003/0078901 A1* | 4/2003 | Coppola, Jr. ............ | G01V 9/02 706/21 |
| 2005/0038763 A1* | 2/2005 | Cole .................. | G01F 23/0061 706/20 |
| 2005/0273300 A1* | 12/2005 | Patwardhan ........ | G06F 17/5009 703/9 |
| 2008/0103738 A1* | 5/2008 | Chandrashekar ..... | H04L 41/145 703/6 |
| 2009/0240433 A1* | 9/2009 | Morris .................. | G06Q 10/04 702/2 |
| 2010/0036880 A1* | 2/2010 | Carpenter ......... | G06F 17/30241 702/5 |
| 2010/0211536 A1* | 8/2010 | Al-Fattah ................ | E21B 49/00 706/21 |
| 2011/0295575 A1* | 12/2011 | Levine .................. | G06Q 30/02 703/2 |
| 2013/0196685 A1* | 8/2013 | Griff ..................... | H04L 43/067 455/456.1 |
| 2014/0156232 A1* | 6/2014 | Cordazzo ............ | G06F 17/5018 703/2 |
| 2014/0278323 A1* | 9/2014 | Wright ............... | G06F 17/5009 703/11 |
| 2015/0071528 A1* | 3/2015 | Marchisio ............ | G06K 9/6269 382/159 |

* cited by examiner

WETLAND MODELING AND PREDICTION

STATEMENT REGARDING FEDERALLY SPONSORED RESEARCH OR DEVELOPMENT

This invention was made with government support under North Carolina Department of Transportation ("NCDOT") Research Project Grant #RP2013-13 "Improvements to NCDOT's Wetland Prediction Model". The government has certain rights in the invention.

CROSS-REFERENCE TO RELATED APPLICATION

The present application is a non-provisional application of U.S. Provisional Patent Application No. 62/003,869, entitled "AUTOMATION PROCESS METHOD OF GENERATING WETLAND PREDICTIVE VARIABLES" and filed on May 28, 2014, and U.S. Provisional Patent Application No. 62/003,887, entitled "AUTOMATION PROCESS METHOD OF WETLAND MODELING AND PREDICTING," filed on May 28, 2014, the entire disclosure of both of which are incorporated by reference in their entireties.

BACKGROUND

Wetlands are important natural resources providing a lot of positive ecological services and are considered to be very valuable area for its environmental functions, such as water quality, wildlife habitat and refuge, and ecosystem services.

However, conventional wetland inventory methods are often time consuming, subjective and inefficient. Indeed, current wetland models require a set of variables (usually more than a dozen) to conduct regression analysis, but the procedures of generating those variables are repetitive and time consuming, especially dealing with data transfer between different software platforms.

SUMMARY

In order to address the above-deficiencies of the wetland variable generating process, embodiments of the present application are directed to an automation process method to generate a set of wetland predictive variables using Light Detection and Ranging ("LiDAR") data within a geographic information system ("GIS") software platform, according to some embodiments.

The automation process method and models of the present application enable reliable identification of wetland and stream locations using GIS, thereby reducing the time and cost of field delineations and providing early awareness of potential wetland impact areas during the initial project planning process. Additionally, the automation process method and models of the present application is efficient, flexible, speeds the environmental assessment process, and ultimately advances transportation projects while protecting the environment.

DESCRIPTION OF THE DRAWINGS

The objects and features of the invention can be better understood with reference to the drawings described below, and the claims. The drawings are not necessarily to scale, emphasis instead generally being placed upon illustrating the principles of embodiments of the invention. In the drawings, like numerals are used to indicate like parts throughout the various views.

DETAILED DESCRIPTION

Embodiments of the present invention now will be described more fully hereinafter in the following detailed description, in which some, but not all embodiments of the invention are described. Indeed, this invention may be embodied in many different forms and should not be construed as limited to the embodiments set forth herein; rather, these embodiments are provided so that this disclosure will satisfy applicable legal requirements. The following description provides specific details for a thorough understanding and enabling description of these examples. One skilled in the art will understand, however, that the invention may be practiced without many of these details. Additionally, some well-known structures or functions may not be shown or described in detail, so as to avoid unnecessarily obscuring the relevant description.

Wetland Modeling and Prediction

The one-button automation process method of wetland modeling and prediction is built by the following selective modules: Modeling, Prediction, Post-Treatment, Analysis and Display, as provided by FIG. 1.

The modules can be flexibly organized as required. As usual, the following rules are set:

The "Modeling" module should be before the "Prediction" module, if they are connected. However, the "Prediction" module can be also as individual starting block if a pre-set model is input or set to the "Prediction" module.

The "Post-treatment," "Analysis" and "Display" modules can follow either the "Modeling" module or the "Prediction" Module, to do post-treatment, analysis and display to the built modeling data or the predicted data, respectively.

The "Analysis" and "Display" modules can follow any other modules by connection. Thus, these modules can also follow the "Post-treatment" module to do analysis and display the results from post-treatment, respectively.

These modules (sub-processes) can be flexibly connected as a process for a whole automation method.

Some typical organized automation process flowcharts are shown in FIGS. 2A-2D according to some embodiments.

3.2 Module Functions and their Sub-Processes\(Module Process)

Figures 1, 2A:
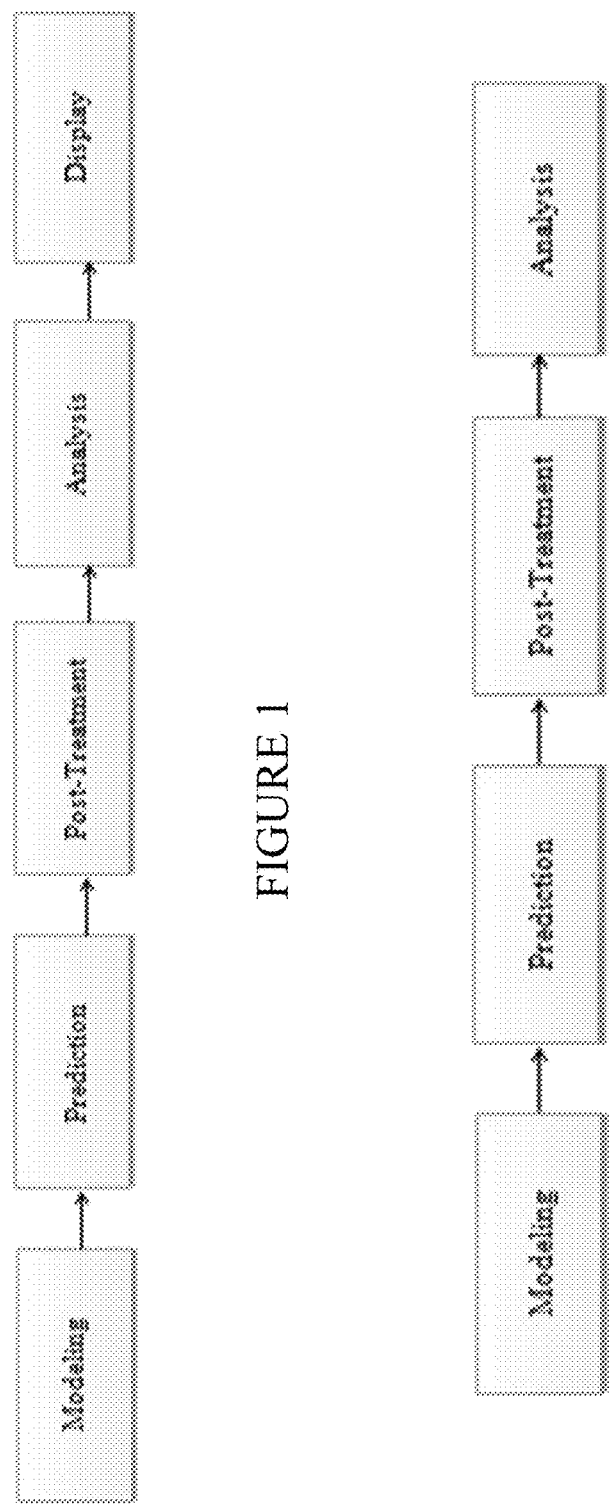
FIG. 1 illustrates types of modules of wetland modeling, according to one embodiment.
FIGS. 2A-2D illustrates modeling processes, according to embodiments.
Figure 2B:
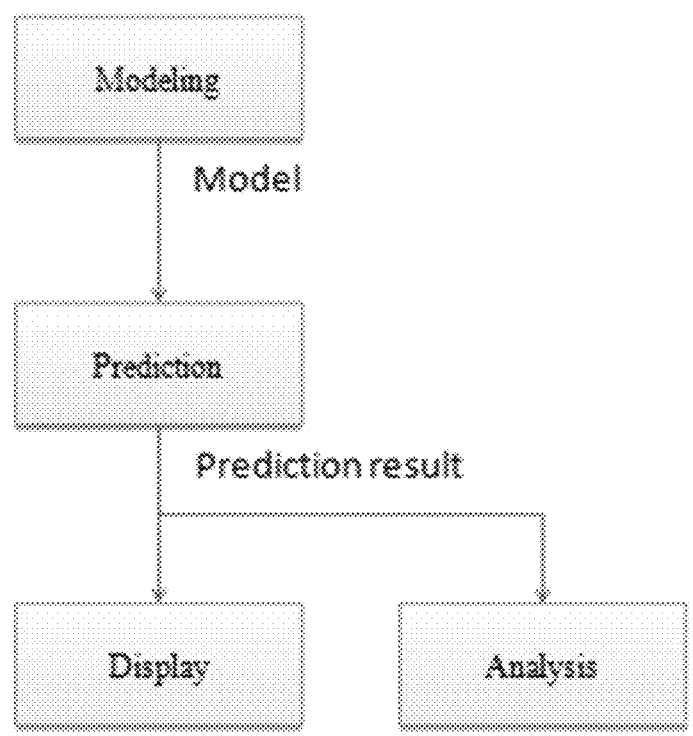
Figure 2C:
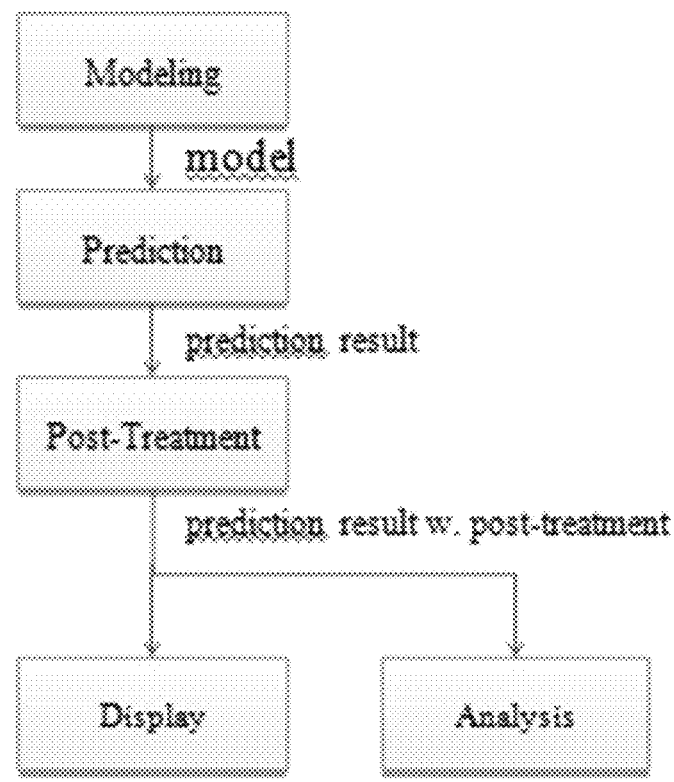
Figure 2D:
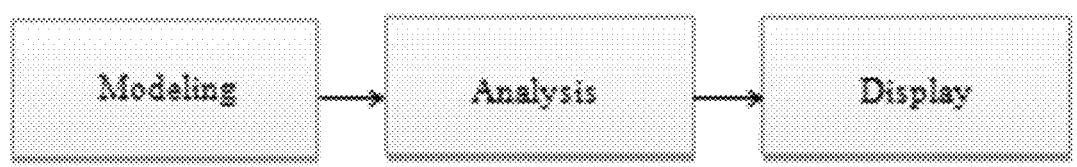

First, a typical process is discussed as shown in above FIG. 2A. Then, the Automation Process Scheme and Method of Wetland Modeling and Prediction with Post-treatment and Analysis may be shown in FIG. 3

Each module process can be executed by just activating only a single button or other activation means. However furthermore, the whole process established by these modules can also be automatically executed by just one action by the user (such as pressing a button once).

The module processes are described below.

3.2.A Modeling Process

Figure 3:
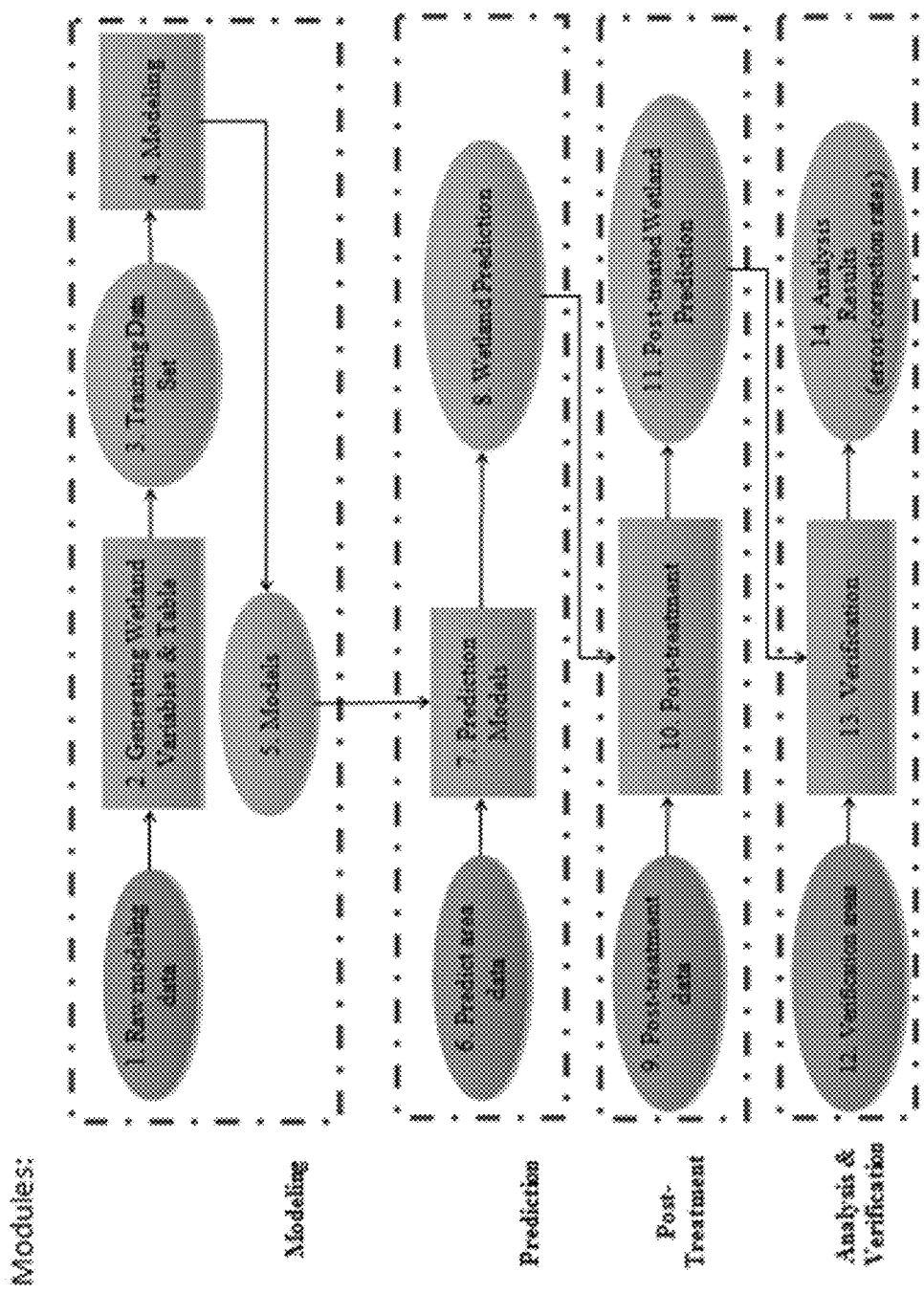
FIG. 3 illustrates a modeling module process, according to another embodiment.
Figure 4A:
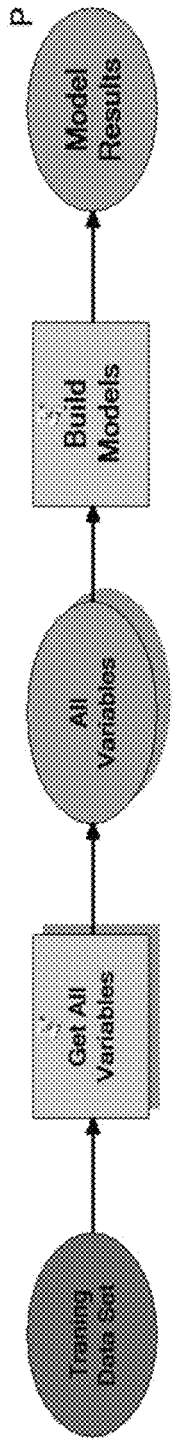
FIGS. 4A-B illustrates modeling module processes, according to another embodiment.
Figure 4B:
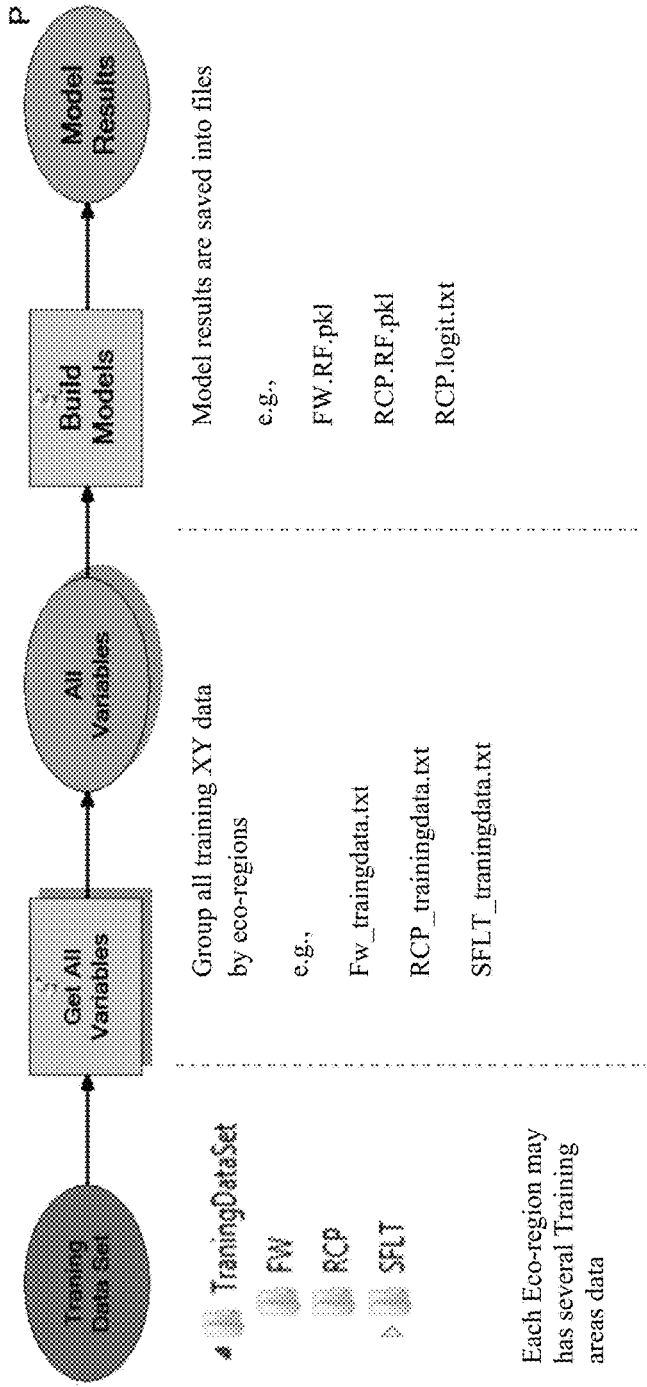

A modeling module process is shown in FIGS. 2 and 3. In that its function blocks (3-5) of the "Modeling" section of FIG. 3 may also be shown as in FIG. 4.

The modeling process can handle various eco-regions, and have the following features (i)-(iv), as well as including some selected ones of followings:

(i) The modeling process can be executed by just pressing one button.
(ii) The input is the sampled original training dataset with its evaluation dataset for modeling.
(iii) The output of the modeling process is its generated wetland model or models with its parameters.
(iv) The modeling method can be selected, e.g., either logistical regression (Logit) or random forest (RF), or the both, or other method.
(v) In the middle step, it generates the variables vector X in raster format from the DEM data.
(vi) The process can automatically search the training data and group them into tables by their respective eco-regions.
(vii) It can output text files with the parameters of each Logit regression model or RF (Random Forest) model in different eco-regions.
(viii) The output files can be used for the prediction process.

Accordingly, it can be seen there may be two tools: one to generate all wetland variables data for modeling, named "Generate Training Table", and another to training/building model based on the selected modeling method or methods, named "Training".

Figure 5:
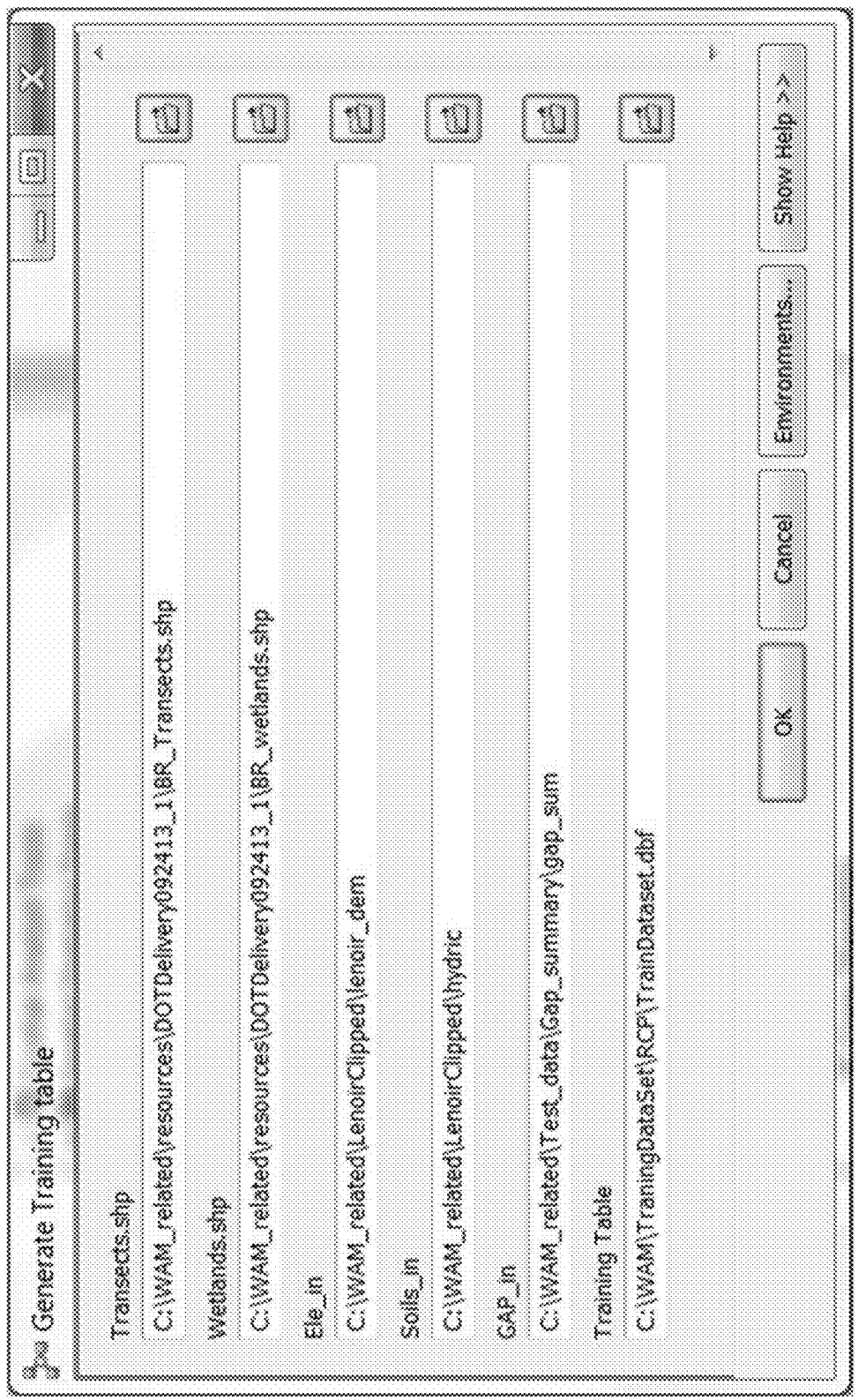
FIG. 5 illustrates an exemplary user interface, according to another embodiment.
Figure 6:
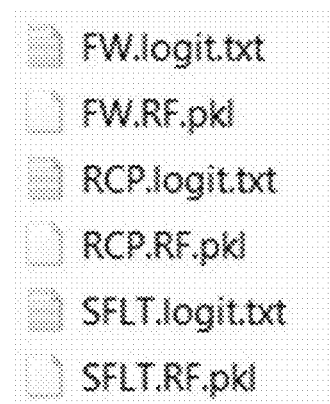
FIG. 6 illustrates three logit models and three RF models output, according to another embodiment.

The tool "Generate Training Table" as in FIG. 3 is to generate the training table of all wetland variables (vector X) values and wetland indicator variable Y values (e.g., from the known wetland boundary) for an area based on the original sampling dataset. The user interface is shown in FIG. 5. An example detail of Tool "Generate Training Table" is in FIG. 6.

The tool "Training" generates the model based on the selected modeling method, e.g., Logit and/or RF, from the training dataset from the output of "Generate Training Table".

The output of the "Modeling" module is a model with model parameters for Logit method, or a set of random trees for RF method, or other kind model via its corresponding modeling method set in the module.

Provided is an example: If the considered region includes three different eco-regions as Rolling Coastal Plain (RCP), Flatwoods (FW) and Southeastern Floodplains and Low Terraces (SFLT), then the modeling module process may generate 3 models for each eco-region respectively. If one uses two different modeling methods (e.g., as logit and RF), then one may have total six models as listed in FIG. 7 for all three eco-regions and two methods. The input training data set under each folder, e.g., folder FW, may have one or more training area data tables to the corresponding training wetland areas as FW eco-region type, respectively.

Figure 7:
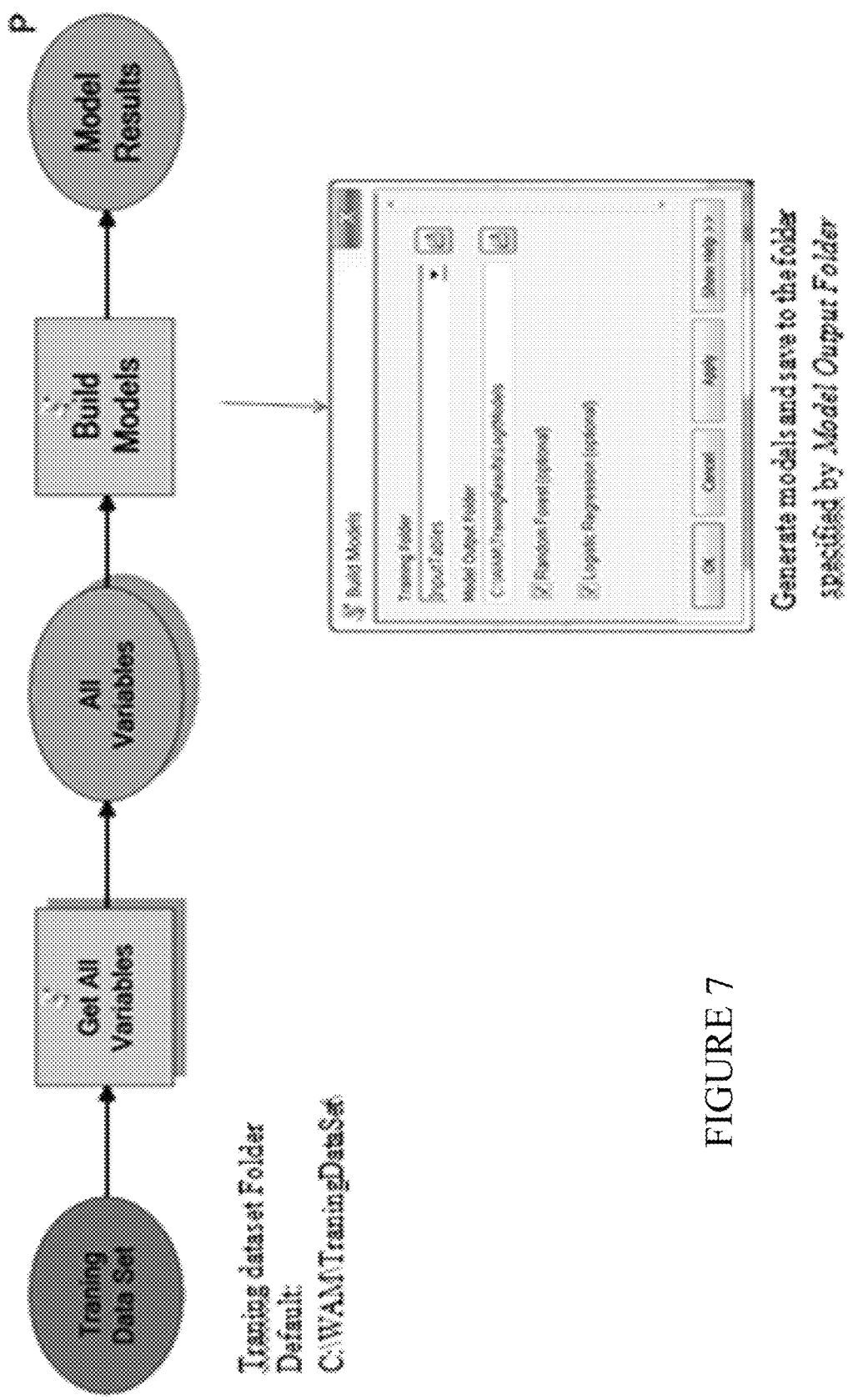
FIG. 7 illustrates a workflow of the too "Train/Modeling", according to another embodiment.
Figure 8:
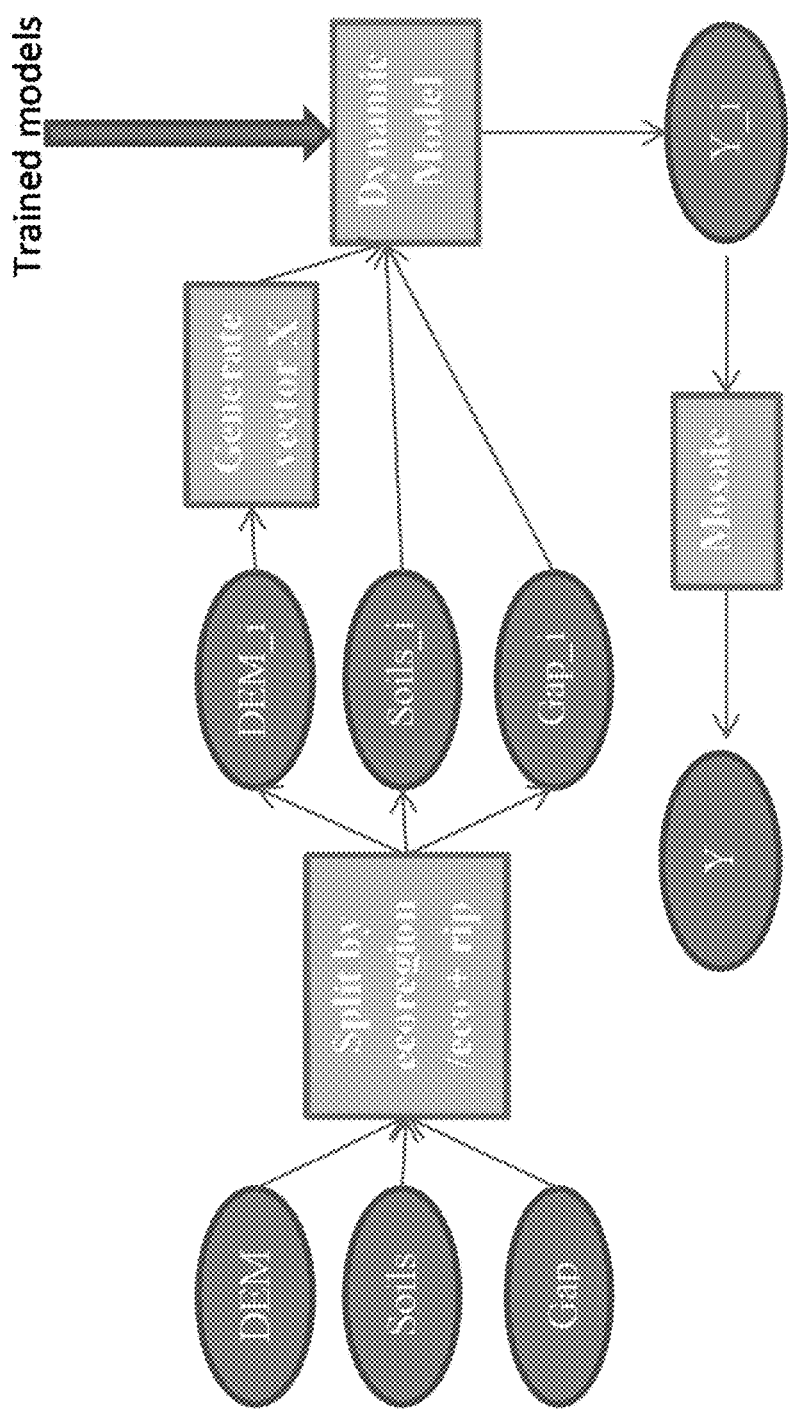
FIG. 8 illustrates a diagram of wetland prediction process and its automation, according to another embodiment.

By one-button-click, three logit models and three RF models will be output to the folder, e.g., FIG. 7. The train tool workflow is as shown in FIG. 8.

3.2.B Prediction Process

Figure 9:
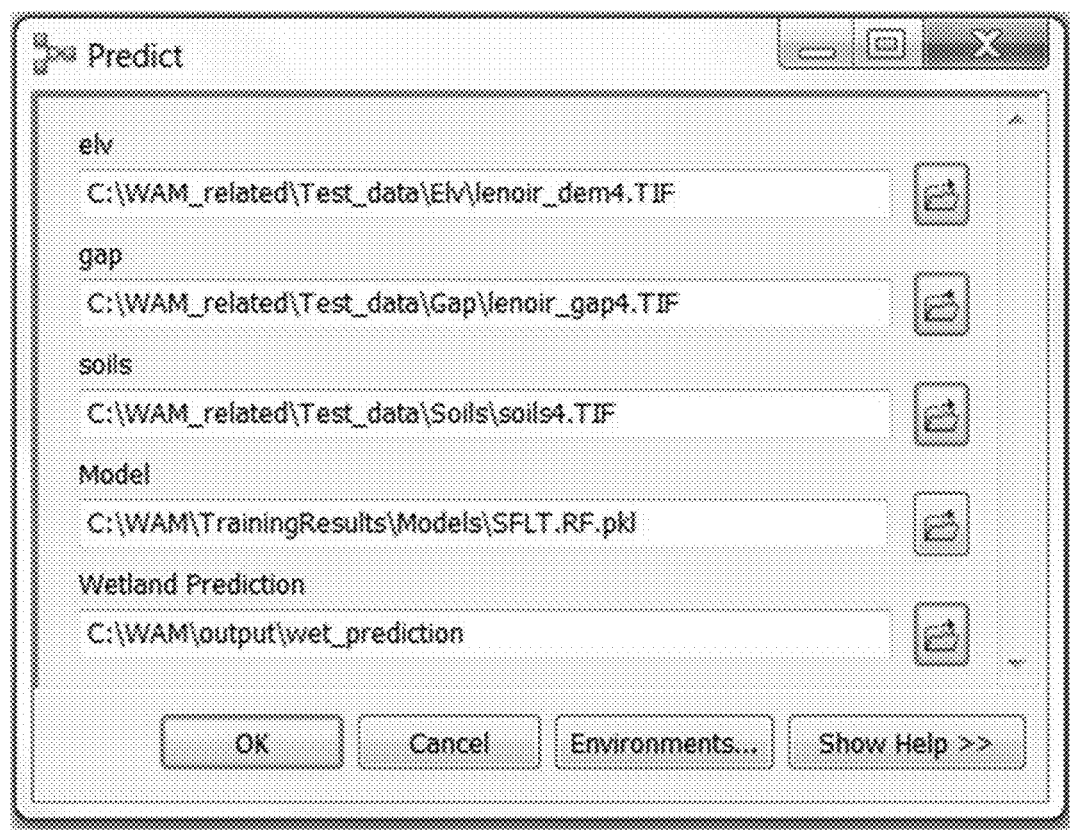
FIG. 9 illustrates an example user interface of the tool Predict, according to another embodiment.
Figure 10:
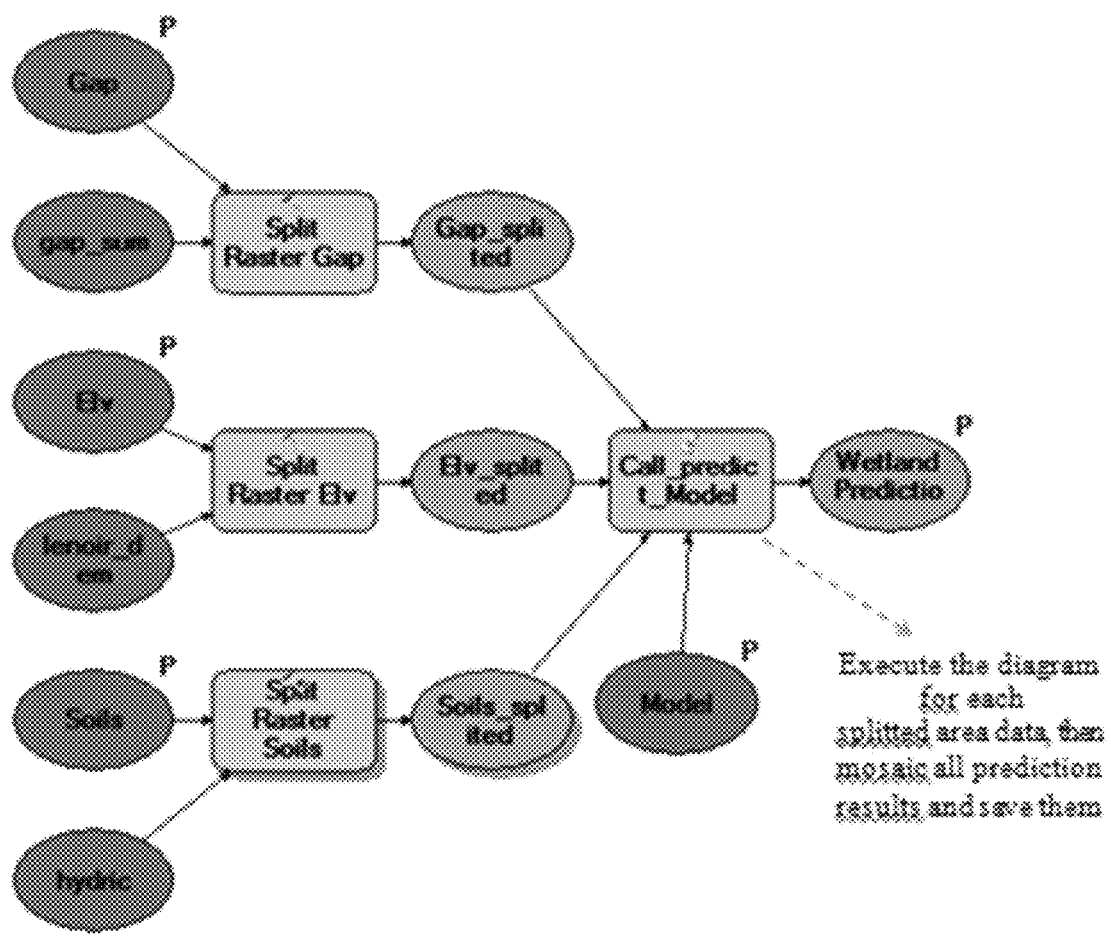
FIG. 10 illustrates an example detail diagram of the tool Predict, according to another embodiment.

The prediction module process may be shown in FIGS. 2 and 3 above and FIG. 9 below, where FIG. 9 shows the corresponding eco-regions split when the modeling module has its output of the eco-regions models respectively. It has the following feature: to use the established model to predict the variable Y (wetland/non-wetland) from the wetland variable vector X in the prediction area. In the program, the tool for this prediction module is referred to herein as "Predict." The exemplary user interface of Predict tool is shown as FIG. 10.

Figure 11:
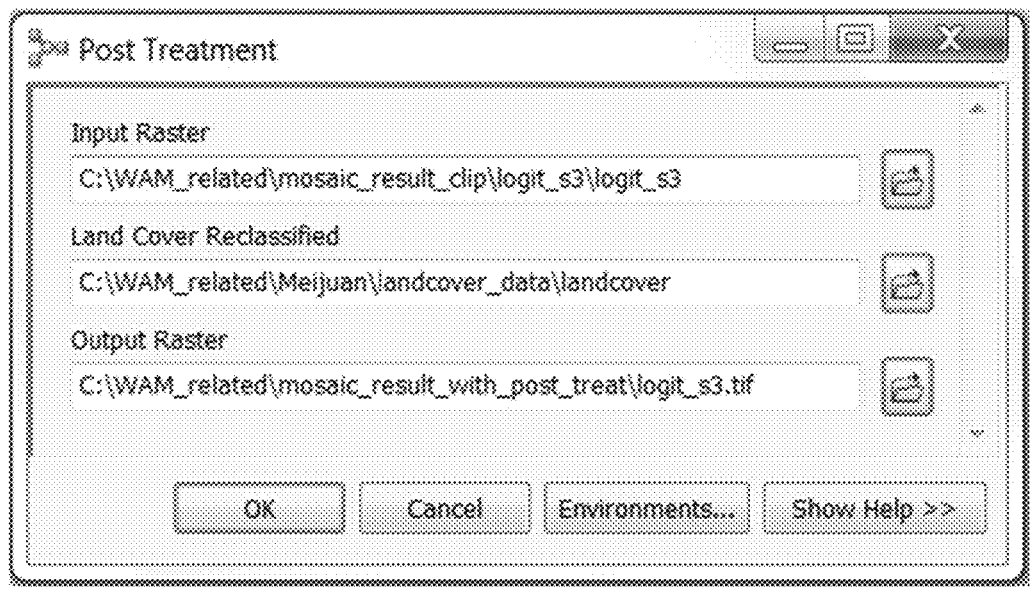
FIG. 11 illustrates an example of the user interface of the tool Post-Treatment, according to another embodiment.

An example detail of this Predict tool (Prediction Module) is shown in FIG. 11.

Figure 12A:
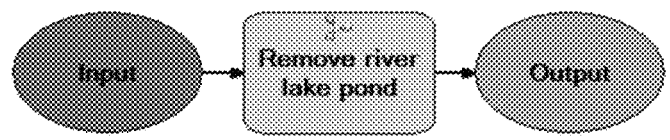
FIGS. 12A-C illustrates post-treatment processes, according to another embodiment.
Figure 12B:
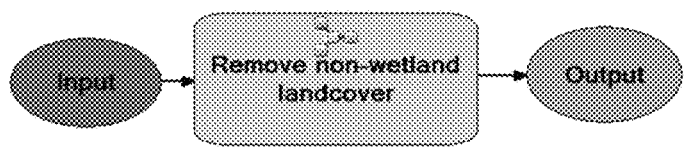
Figure 12C:
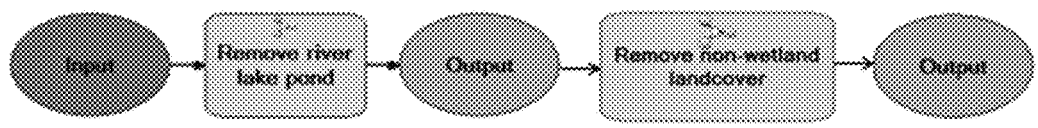

When the input data with large size, the system will/may automatically call the big data version of predict tool. That workflow is shown in FIG. 12. In the big data version, the input raster (elevation, soils, gap) are split into small area data set with buffer area, then the module tool predicts the wetland one by one. Finally, the prediction results of these small areas are combined together into a same file as mosaic and ready for display in GIS (ArcMap).

3.2.0 Post-Treatment Process

The post-treatment module is to run post-treatment for the modeling module to improve the model, or for the prediction module to improve the prediction. Its function may include various ones based on some important variable information, e.g., to remove the incorrect wetland area which is definitely non-wetland area based on the "stream" data information (such as river, lake, pond), or based on the land cover data (such as human building and farm area, etc), or based on the soil data information. It is usually much useful for prediction accuracy. One example user interface of the post-treatment module is shown as FIG. 13.

Figure 13:
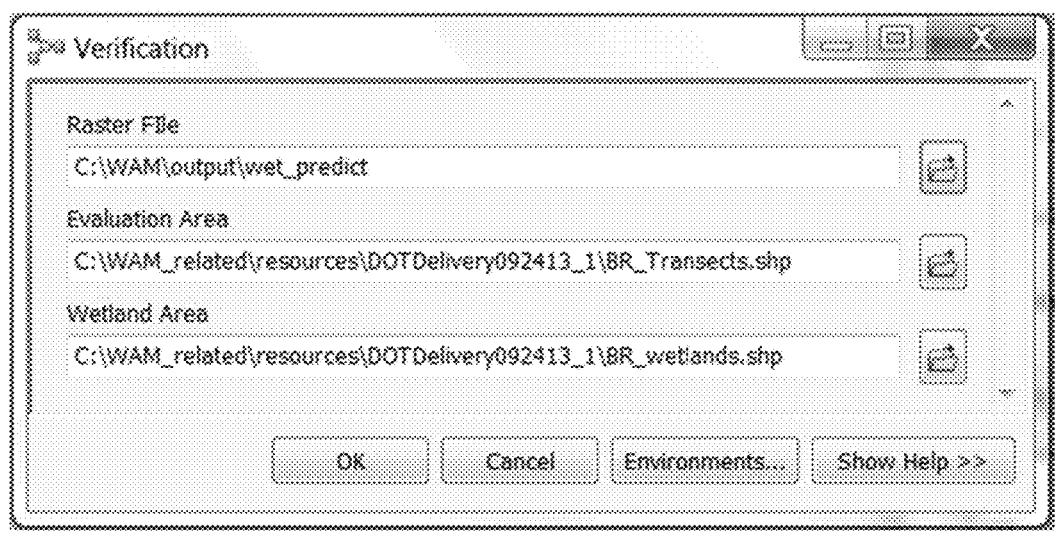
FIG. 13 illustrates an example user interface of the tool Analysis/Verification, according to another embodiment.

In the example of FIG. 13 user interface of Tool Post-Treatment:

Input/type the wetland prediction data file name (in some case it may be the modeling resultant wetland data).
Input/type the reset special variable data information file name (e.g., land cover, or stream/river/lake).
Type the output file name for the post-treatment treated wetland prediction data.

For example, the stream data is from CONUS_wet_poly by U.S. Department of the Interior, Fish and Wildlife Service for NC river, lake, and pond data.

Figure 14:
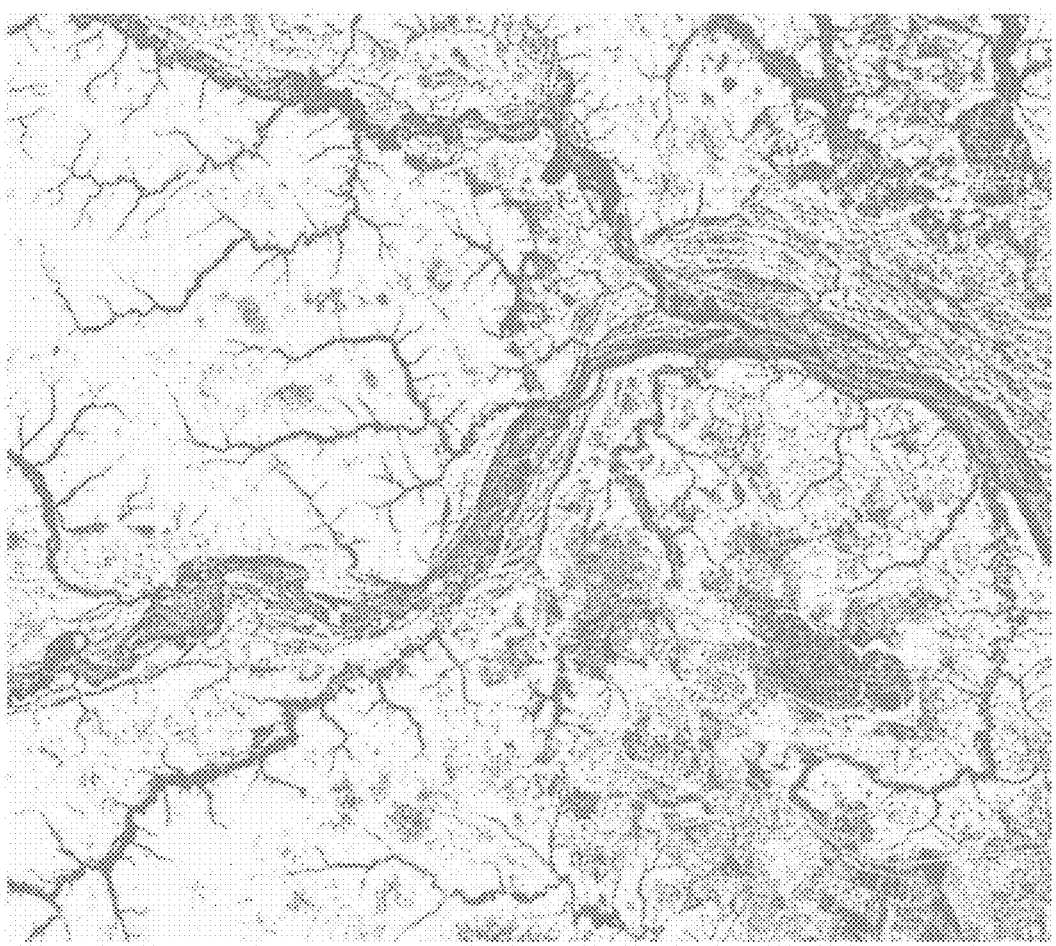
FIGS. 14-15 illustrates exemplary wetland prediction results, according to another embodiment.

An example workflow of a Post-Treatment is shown in FIG. 14. This example basically can include the following one or two parts: (1) To remove rivers, lakes and ponds from the prediction results, and/or (2) To remove the wetland area from the prediction results based on the land cover data.

3.2.D Analysis Module

The analysis module has function to evaluate the modeling accuracy or prediction accuracy, i.e., error/correctness rates when the checking/evaluating area wetland information is available or has been evaluated.

Figure 15:
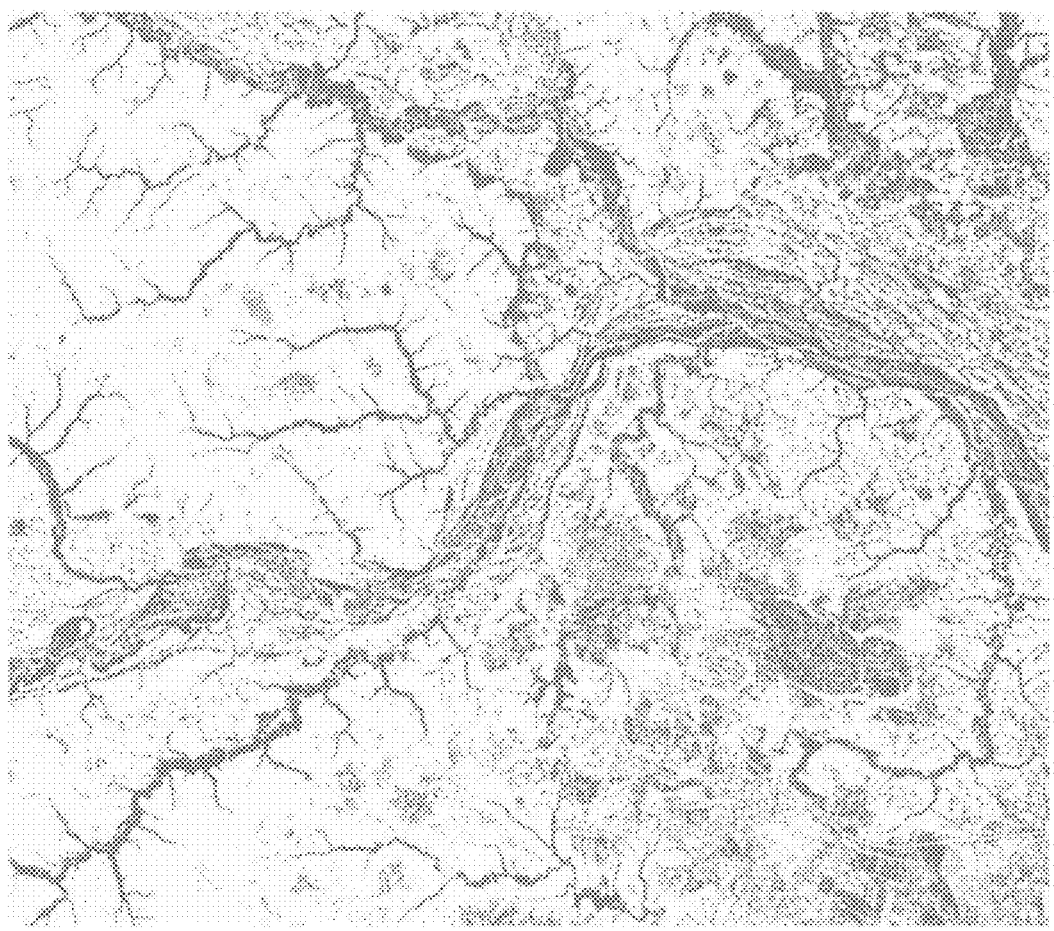

For example, assuming the wetland is 1 and non-wetland is 0, the true wetland value is in the left and the prediction value or model value in the right. Then there is a set of possible combinations as 1-1 (correct wetland prediction), 0-0 (correct non-wetland prediction), 1-0 (missed wetland), 0-1 (wrongly predicted wetland). This analysis module will automatically output the correctness rates and error rates for the above 4 cases and/or total error rate. Its interface may be as shown in FIG. 15 as an example.

3.2.E Display Module

The visualization is integrated in the display module. The wetland prediction result will be automatically shown once it is finished by this module. This module can also display the modeling result. Furthermore, this module may also be combined into the other module as an inherent one, i.e., built-in.

EXAMPLES

Figure 16:
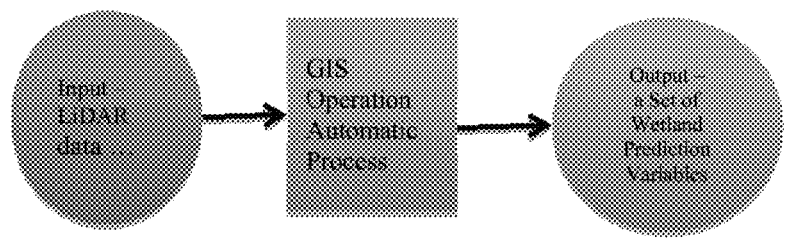
FIG. 16 illustrates an automatic process scheme of wetland predictive variables generation, according to another embodiment.
Figure 17:
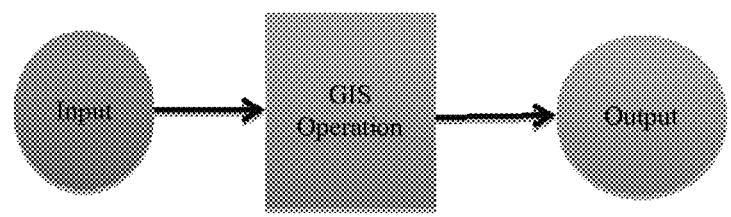
FIG. 17 illustrates an GIS workflow atom component, according to another embodiment.

Examples for this automation process and results are shown in FIGS. 16-17. FIG. 16 shows a wetland prediction map without the post-treatment in a study area, while FIG. 17 shows a wetland prediction map with the post-treatment in that same study area. The dark areas stands for wetland.

Conclusion

The presented automation process method of wetland modeling and prediction has functions in a group of the following module functions from the modeling, prediction, post-treatment, analysis and display modules. Even more, some modules can also be combined as a single module.

It can be an automation process as a single activation (e.g., a one button press) automation process. Based on the correct modeling and prediction method and the high quality data (e.g., from LiDAR), this automation process can not only complete the automated process of wetland prediction, but also dramatically decrease the cost of outdoor field survey, and help environment protection with high quality for the plan and constructions.

Generating Wetland Predictive Variables

The wetland model is based on LiDAR data and other related data, e.g., soil data and land cover data. For example, the NCDOT wetland prediction model has a set of selective wetland predictive variables from a list as listed in Table 1 below.

TABLE 1

Wetland predictive variables in prediction model

| Name | Full Name | Formula and Meaning |
|---|---|---|
| DEM | Digital Elevation Model | Elevation of each cell: z(x, y). |
| Asp | Aspect | Asp = 57.29578 * atan2 ([dz/dy], −[dz/dx]) |
| Slp | Slope | $s = 57.29578 \times \mathrm{atan}\left(\sqrt{dz/dx^2 + dz/dy^2}\right)$ |
| Cv | Curvature | Slope of the slope: $cv = 57.29578 \times \mathrm{atan}\left(\sqrt{ds/dx^2 + ds/dy^2}\right)$ |
| Prcv | Profile Curvature | curvature on verticle (y) direction |
| Plcv | Plan Curvature | curvature on horizontal (x) direction |
| Bawi | Ratio of Slope by Drainage Area | Bawi = s/drainage contributing area (calculated with breach-all DEM) |
| Wei | Wetness Elevation Index | Series of increasingly larger neighborhoods used to determine the relative landscape position of each cell. |
| WeiRe | Wei Reclassification | Cell wei value will be reclassified as 0 if original value is bigger than threshold, else be reclassified as 1 (using user input threshold). |
| Mdec | Maximum Downslope Elevation Change | Maximum difference of z(x, y) between the cell and its neighbor cells. |
| Rawda | Stochastic Depression Analysis | Stochastic depression analysis based on raw DEM. |
| Curv5 | Smooth Curvature | Each cell gets mean value from its 5*5 neighbors. $Cur5 = \sum_{i=i1}^{i25} \frac{cv(i)}{25}$ |
| Depan | Stochastic Depression Analysis | Stochastic depression analysis based on breach-all DEM. |
| CREWS | Prediction Result from Previous Model | 1 means wetland and 0 means unpredicted area. |
| Lc | Land Cover Data | Categorized land use types. |
| Soil | Soil Data | Be reclassified as 1 or 0 to indicate hydric or non-hydric soil type. |

In the existing work process, the above variables are generated with different GIS software, such as ArcGIS, TAS, TauDEM and Whitebox. TAS supports different data formats from TauDEM and ArcGIS, thus it executes format transfer before function execution. Therefore, most of the steps are executed manually in current variable work flow.

In one embodiment, an automated process generates the set of wetland predictive variables is not provided, but also urgent for an efficient speed process as recognized as well as a methodology to avoid errors during the manual process.

4.2 Objective and Architecture of the Automation Process

The automation process objective of the wetland variable generation is to integrate the entire workflow on a specific platform to reduce time consumption of data transferring and manual operations. That is to improve the efficiency of the prediction process with the focus on an automation solution to produce useful variables for wetland prediction automatically.

Figure 18:
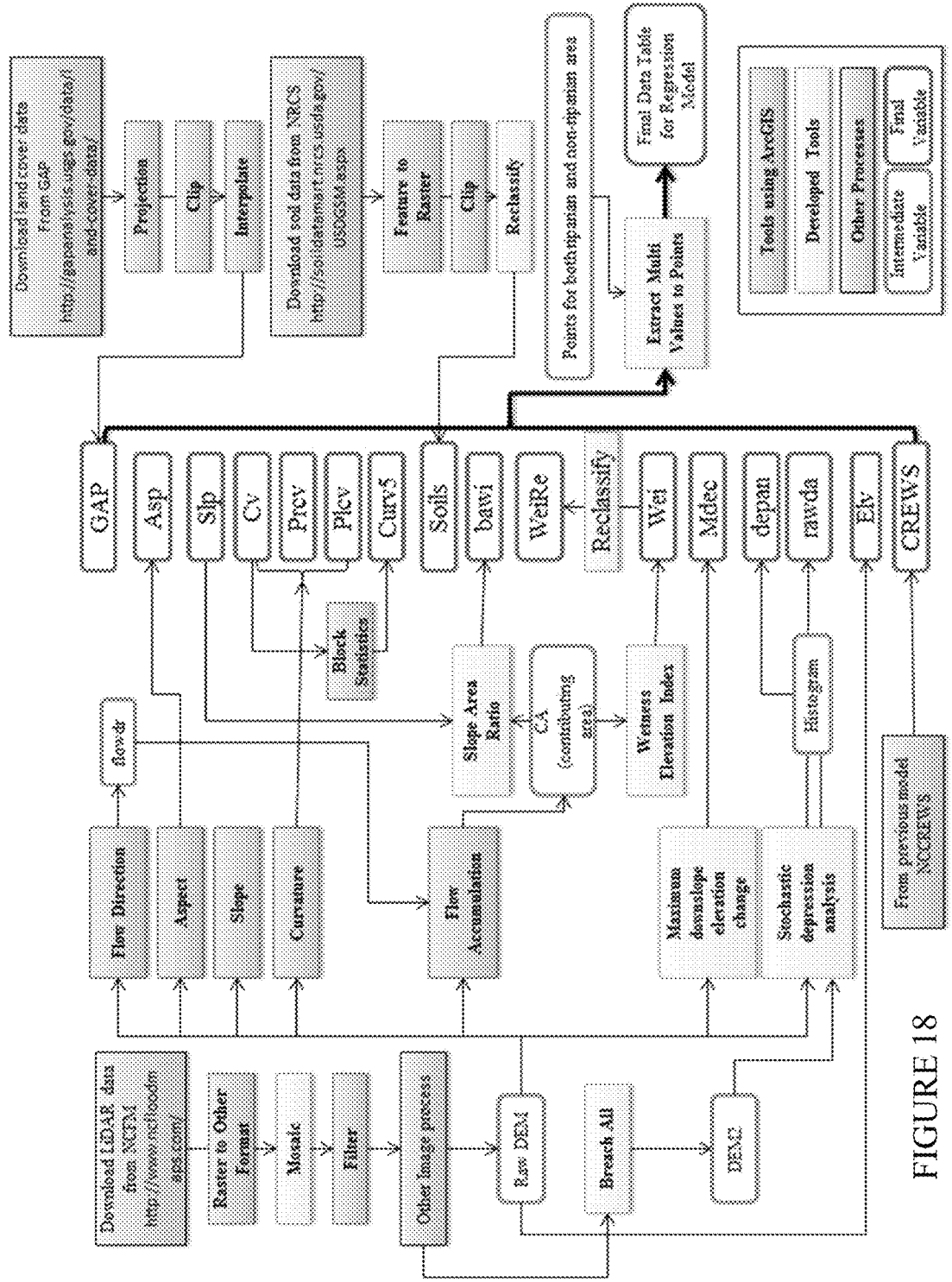
FIG. 18 illustrates an exemplary method of wetland prediction, according to another embodiment.

The general process architecture is a totally automation process for generating the wetland predictive variables in FIG. 18, just with a start "button" press.

4.3 Function Organization

The total automatic process disclosed herein is completed by a series of "atom" components process. The atom component in GIS workflow is shown in FIG. 19, with input data, GIS function, and output result.

Figure 19:
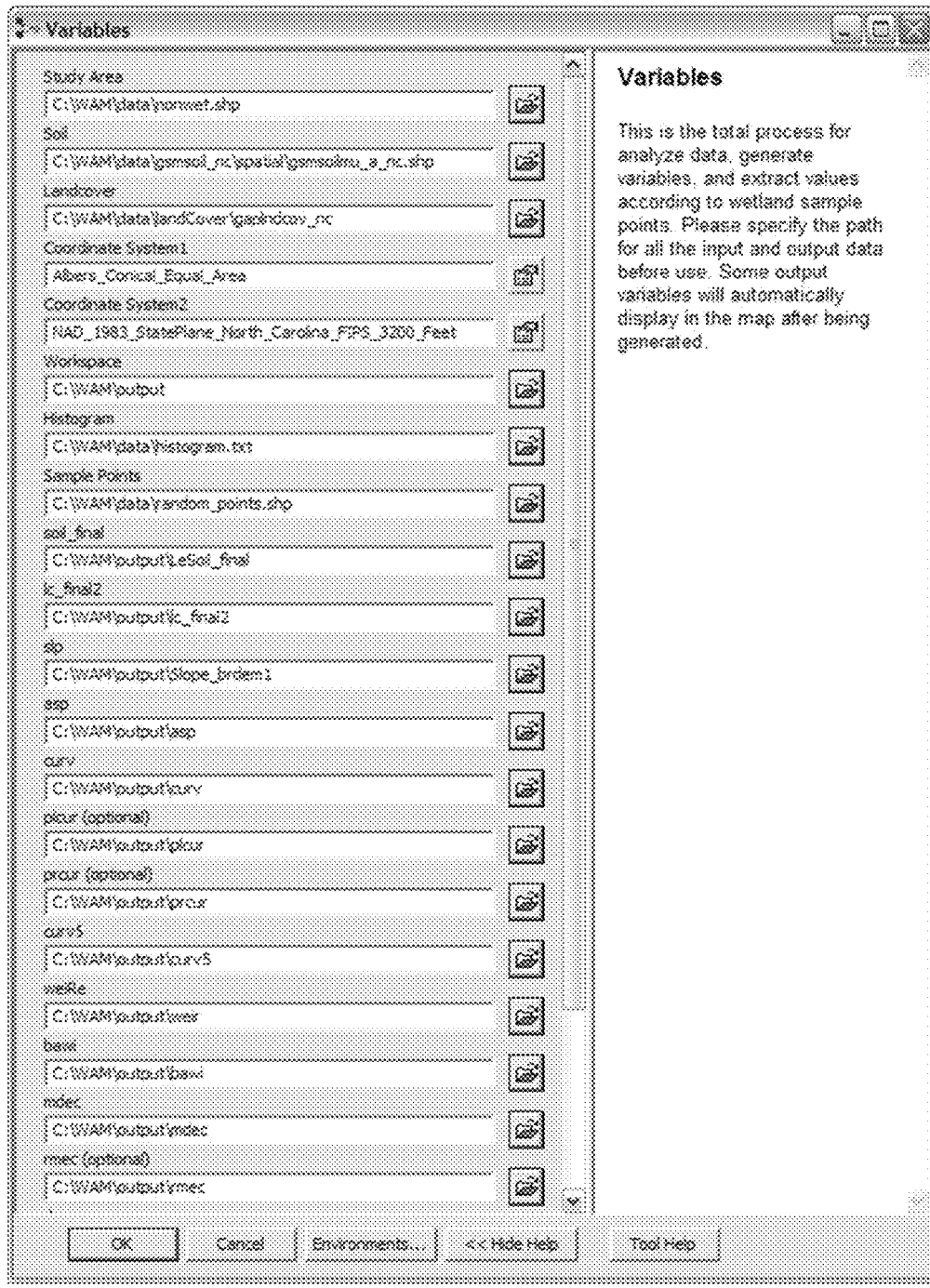
FIG. 19 illustrates an exemplary user interface, according to another embodiment.

GIS workflow under ArcGIS is composed of the basic components of FIG. 19. Output of one operation could become an input of another function, thus to connect those atoms into a geo-processing chain.

Figure 20:
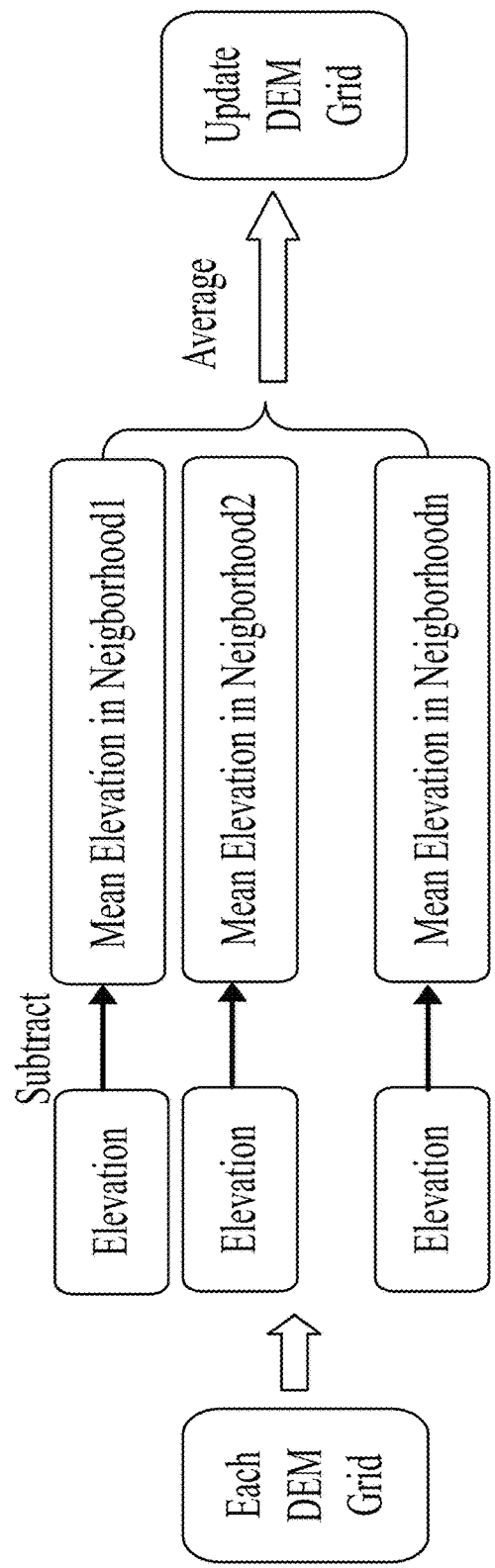
FIG. 20 illustrates an exemplary method to deal with land cover and soil data, according to another embodiment.
Figure 21:
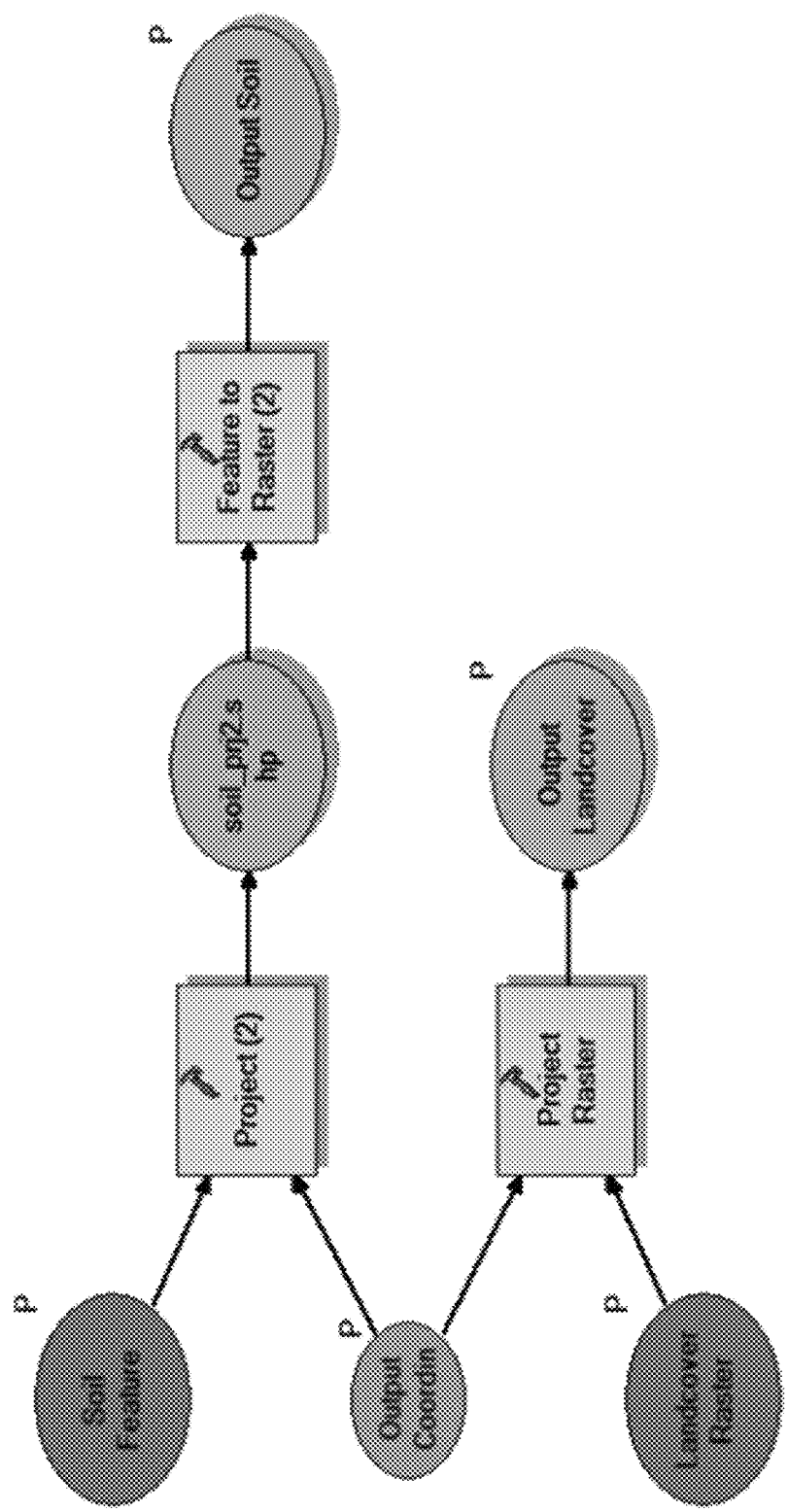
FIG. 21 illustrates an exemplary method deriving the wetness elevation index, according to another embodiment.
Figure 22:
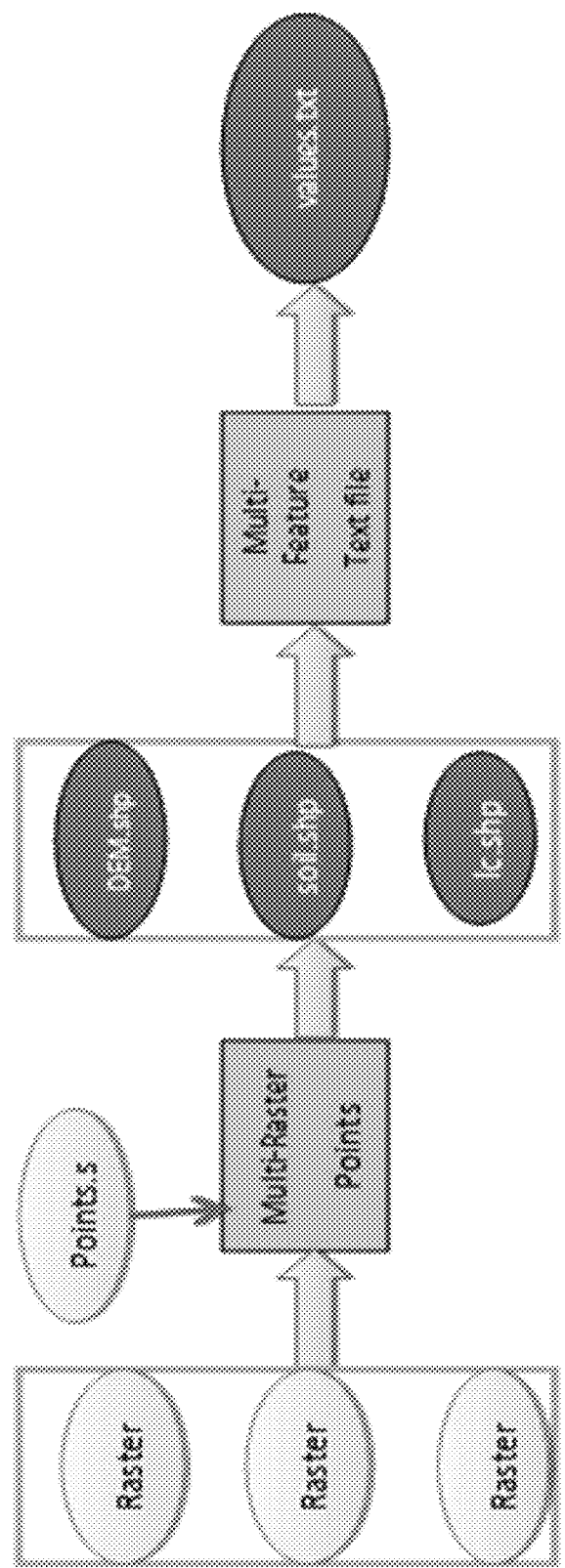
FIG. 22 illustrates an exemplary method for the tool used to extract multiple raster values to a text file, according to another embodiment.

In the platform, the direct use of ModelBuilder in ArcGIS is combined or used along with customized software development, e.g., by python script, or C++, or Java, as individual GIS tools. One kind of the automation process is shown as in FIG. 20 with a scheme framework chart, where red blocks are tools available or easily set in ArcGIS software, but green and grey blocks indicate the functions and processes necessary for the critical task of automation by our newly development. Further, FIG. 21 shows an overall automatic process workflow scheme chart for that kind process as in FIG. 20. FIG. 22 shows a collective interface for the workflow, which is easy for users to set and select one time for all.

3.4 Automation Process for Generating a Set of Wetland Predictive Variable

Here, further described is special function implementation in the automation process of generating wetland predictive variables, thus the process can assemble these functions making a whole automation.

Wetness Elevation Index (Wei)

Figure 23:
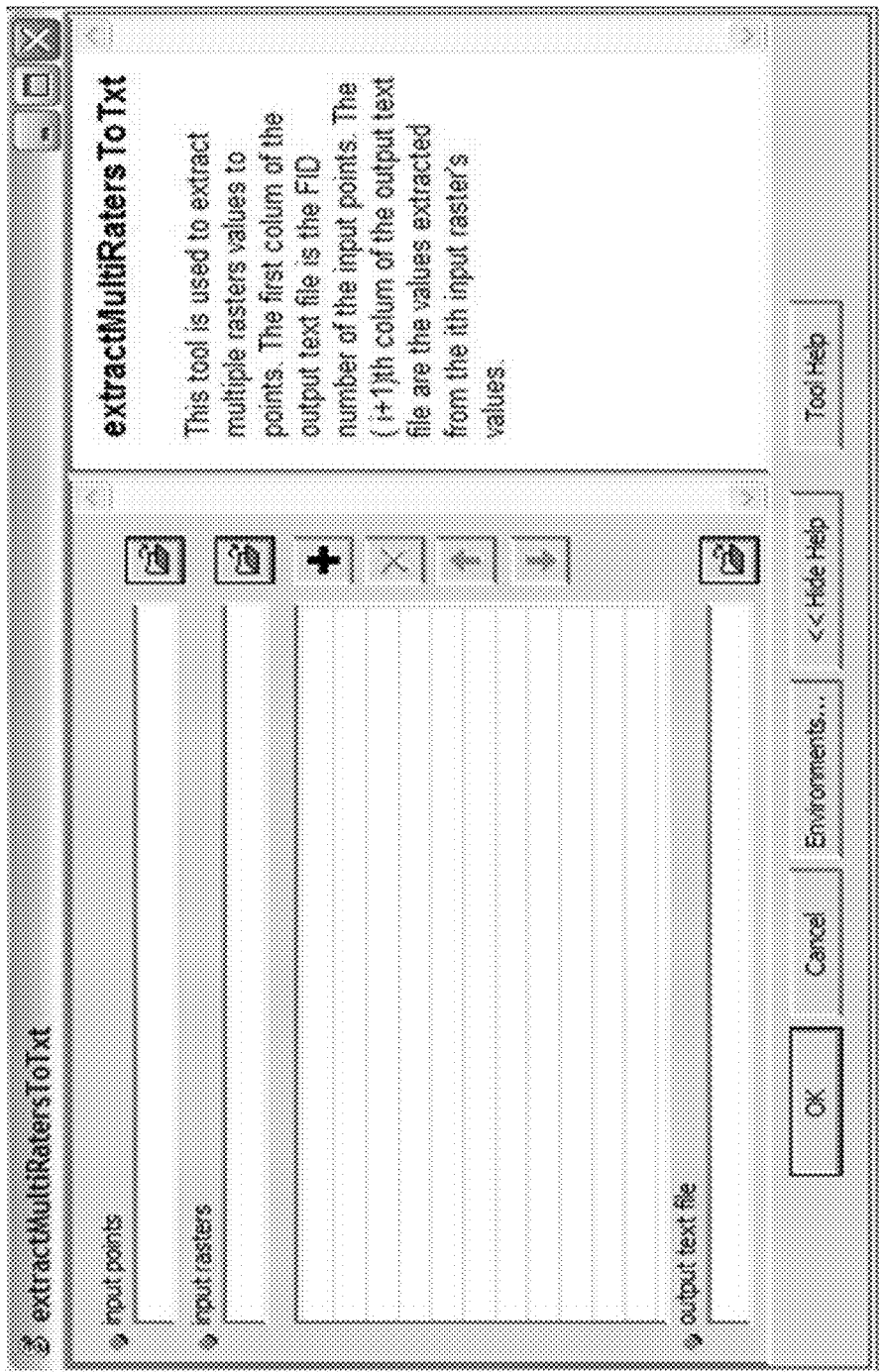
FIG. 23 illustrates an exemplary user interface for the tool to extract multiple raster to text, according to another embodiment.

The wetness elevation index (Wei) measures the relative elevation in neighborhood of one cell at different scales. At each scale, relative elevation is calculated by subtracting the average elevation in a neighborhood. Then, the relative elevation at different scales will be added to get the average value. This indicator can represent overall elevation of a cell as in FIG. 23.

Stochastic Depression Analysis (SDA)

Java may be used to develop this SDA tool to do stochastic depression analysis into ArcGIS. A depression is usually referred to as a sink, which is a location with the low elevation without downslope flow path to any other neighbor area. Land depression is a factor for the occurrence of wetland, which can be analyzed from hydrologic behavior of the stream system. In our data analysis, we applied the SDA (Stochastic Depression Analysis) method to identify the depression from the DEM data. The tool for SDA may be developed by Java and ArcObjects into ArcToolbox and Model Builder.

Breach Depression

For flow analysis, breaching artifact depression is provided to correct drainage topology of DEM. In the present automation, code is developed for a depression breaching algorithm. This method can go along the flow path from the outlet to the depression bottom.

As the SDA, a breach depression tool is developed by Java and ArcObjects into ArcToolbox and Model Builder such that it can be easily integrated into ArcGIS workflow.

Resolution Uniform Process

The DEM LiDAR data are in cells of a×a feet (e.g., 20×20). But Land cover data and/or soil data are raster-based, with a spatial resolution of b×b meters, where b may be not equal to a, e.g., b=30 as 30×30 m2. So, our automation process system has function to do this automatic resolution change to as the DEM resolution.

Soil and Land Cover Variables

Figure 24:
FIGS. 24-28 illustrate exemplary experimental data, according to some embodiments.

A special data process before the variables are being extracted to a text file may be needed and processed for the coordinate system issue if existed. It is as shown in FIG. 24. However, if the data is already in the required format, then there is no need to go through this procedure. The process has choice for users to select.

Multi-Values Extraction Tool

Figure 25:

After all the data of the variables have been generated, a multi-values extraction tool has a function to extract these values into one file for further regression or analysis as shown in FIG. 25.

Figure 26:
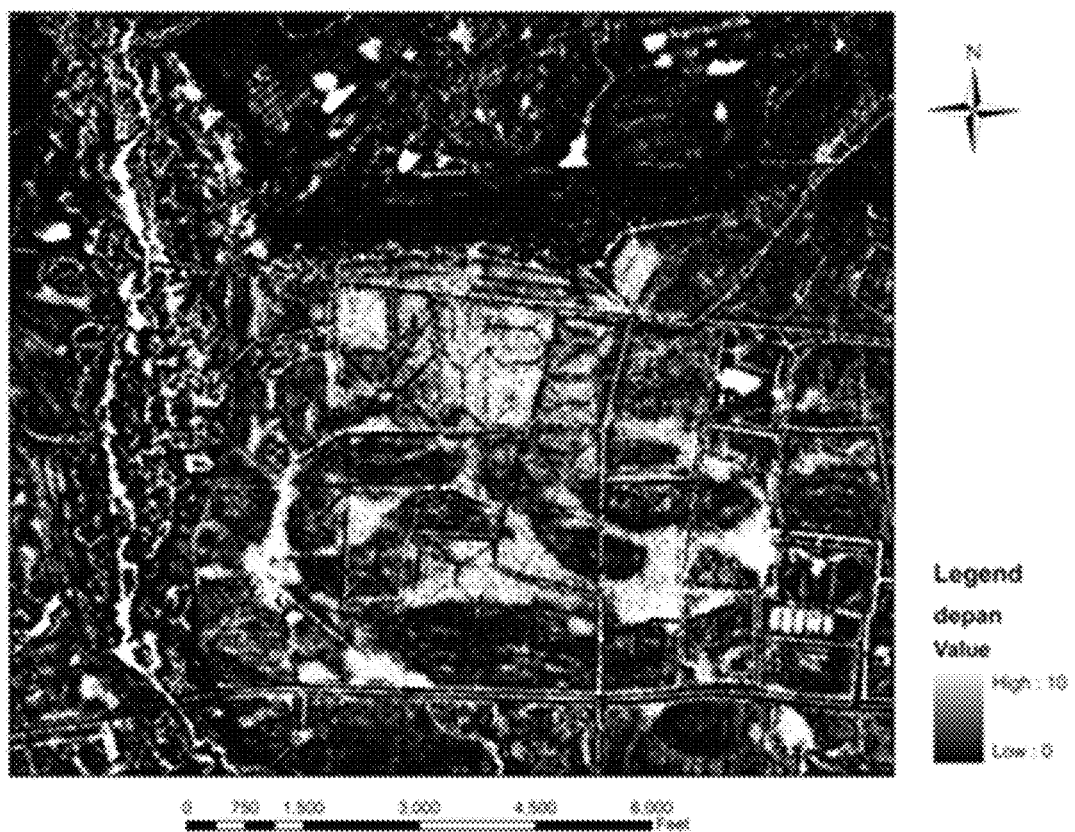

The user graph interface of this tool is illustrated in FIG. 26. The user may input the point feature, the raster layers and a location for the output text file. After that, all values of these variables will be automatically extracted to the text file by clicking "ok" button for example.

4.5 Experimental Data

Figure 27:
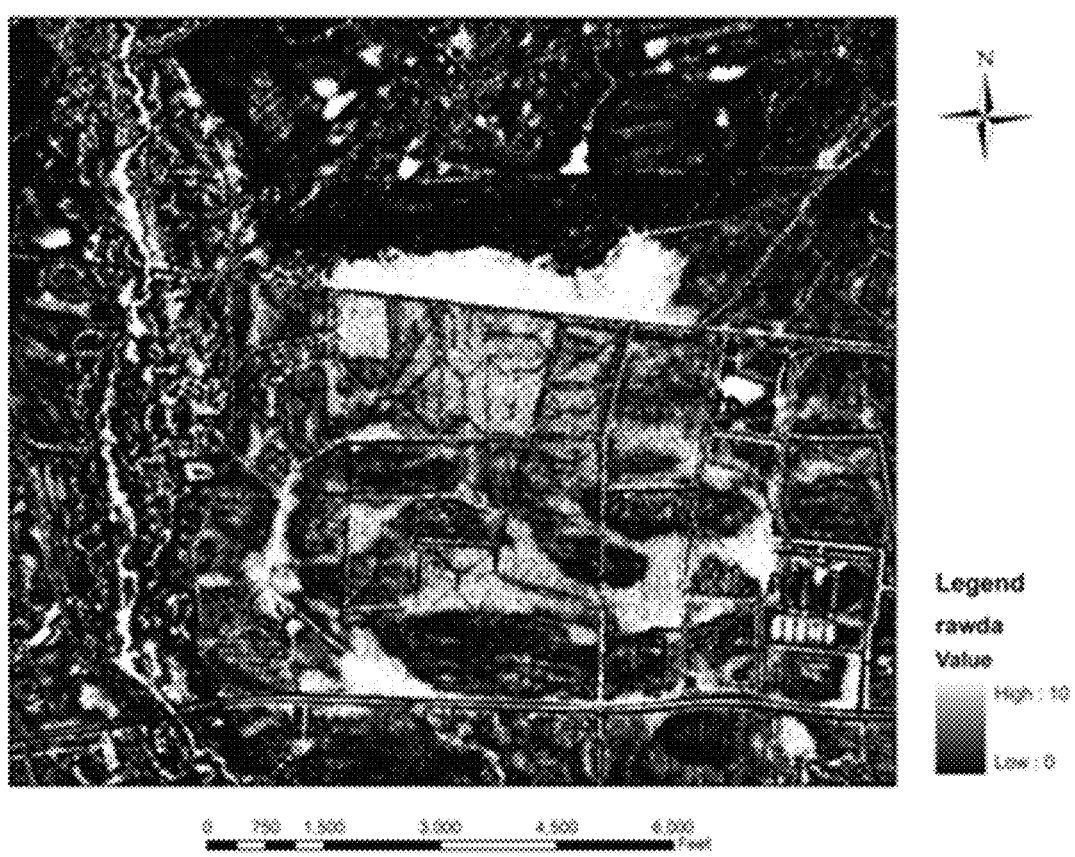
Figure 28:

A study area was selected as Lenoir County, N.C. as shown in FIG. 27. The DEM data is provided in FIG. 28.

The automation system only needs to input the data in the study area, including (1) DEM data, (2) study area boundary, (3) land cover data, (4) soil type data, and (5) user selected parameters and information for the process.

When the original data are readily to input, the innovated automation process as described above will automatically generate these wetland predictive variables by a button press.

Figure 29:
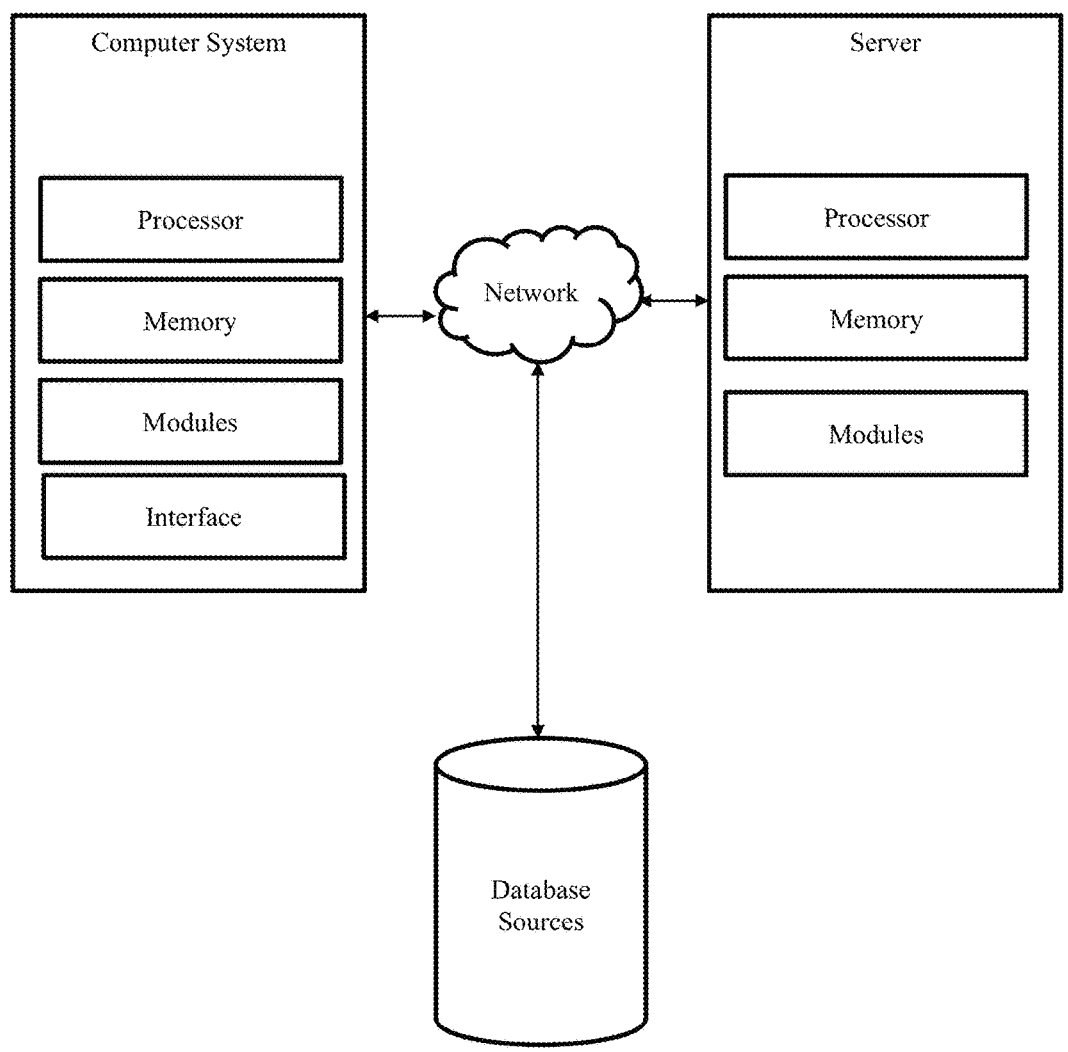
FIG. 29 illustrates a block system diagram of wetland modeling according to at least one embodiment.

Some generated variables are shown in FIGS. 29-31. The set of wetland predictive variables is automatically generated and able to display as in these figures.

4.6. Summary

The above presented description is an exemplary automation process method and its derived software and program product for wetland variable generation. It enables users to predefine all the parameters, and run the whole process by a single click on "start" button or the like on the interface. This automatic process can save time significantly, and is flexible for various areas.

The significance of LiDAR implementation into wetland identification and modeling, as stated by the FHWA is to exemplify how innovative technologies can be used to speed the environmental assessment process and ultimately advance transportation projects while protecting the environment. The application can benefit at large to various agencies, organizations and companies by innovative process and significant labor saving in the NEPA process, and peoples by environment protection inventory.

FIG. 32 illustrates a block system diagram according to at least one embodiment. A computer system may be connected to a server and/or one or more database sources over a network (e.g., the Internet or an intranet). The computer system may be programmed specifically with the algorithms discussed herein. The computer system had a memory and a processor. The memory may be non-transitory computer-readable memory that stores computer readable modules which, when executed by the processor, perform one or more operations discussed herein. It should be noted that the server may store and execute one or more modules so that some (or all) of the operations discussed herein are performed on the server and one or more operations are performed on the computer system The computer system may have an interface to receive instructions from the user such as an activation for the system to automatically perform as mentioned about.

It should be noted that all operations discussed herein may be operable only on the computer system so that all data and operations are performed on the computer system.

The database sources may be any data that can be received and/or used by the computer system as discussed herein, such as LiDAR data. The database sources may be a single database source or a series of separate database sources.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the invention provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the invention can be modified, if necessary, to employ the systems, functions, and concepts of the various references described above to provide yet further embodiments of the invention.

These and other changes can be made to the invention in light of the above Detailed Description. While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

What is claimed is:

1. A computer implemented method of wetland prediction, which can be executed by just one single activation, the method comprising:

receiving, at a computer, training data for a first geographic area including wetland;

generating, using the computer, wetland variables associated with the first geographic area using the training data;

generating, using the computer, a wetland prediction model based on the generated wetland variables of the first geographic area;

receiving, via a user interface, an activation to predict and analyze wetland in a second geographic area different from the first geographic area;

receiving, at the computer, light detection and ranging (LiDAR) data associated with the second geographic area;

analyzing, using the computer, a second geographic area by inputting the LiDAR data into the wetland prediction model automatically in response to receiving the activation and receiving the LiDAR data;

identifying, using the computer, if the second geographic area is a wetland based on an output of the wetland prediction model; and outputting, using the computer, information indicating whether the second geographic area is a wetland.

2. The method of claim 1, wherein the automatically generating wetland variables is performed using a single, integral software program.

3. The method of claim 1, wherein the wetland prediction model is of a model that is selected by a user via the interface among a plurality of models.

4. The method of claim 1, wherein the wetland prediction model is of a model method that is at least one of a logistical regression (Logit) or random forest (RF).

5. The method of claim 1, wherein the geographic area comprises sub-areas which are each modeled or calculated based on different prediction models.

6. A non-transitory computer-readable medium storing a program that, when executed by a computer, performs a method of wetland prediction, the method comprising:

receiving, at the computer, training data for a first geographic area, the training data having data with known values of a wetland and/or non-wetland and data indicating whether the first geographic area is wetland;

generating, using the computer, wetland variables associated with a first geographic area including wetland using the training data;

generating, using the computer, a prediction model based on the generated wetland variables of the first geographic area;

receiving, via a user interface, an activation to predict and analyze wetland in a second geographic area different from the first geographic area;

receiving, at the computer, light detection and ranging (LiDAR) data associated with the second geographic area;

analyzing, using the computer, a second geographic area by inputting the LiDAR data into the wetland prediction model automatically in response to receiving the activation and receiving the LiDAR data;

identifying, using the computer, if the second geographic area is a wetland based on an output of the wetland prediction model.

7. A system comprising:

memory; and a processor in communication with the memory and configured for:

(A) receiving, via a user interface, an activation to start a wetland initiation process;

(B) receiving training data for a first geographic area including wetland modeling data, automatically in response to the activation;

(C) generating wetland variables associated with the first geographic area using the training data;

(D) generating a prediction model based on the generated wetland variables of the first geographic area;

(E) analyzing a second geographic area different from the first geographic area;
(F) receiving, at a computer comprising the processor, light detection and ranging (LiDAR) data associated with the second geographic area;
(G) analyzing a second geographic area using the prediction model and the LiDAR data; and
(H) identifying if the second geographic area is a wetland based on an output of the prediction model automatically in response to the analyzing,
wherein steps (B)-(H) are all performed with the activation in step (A) being the only activation being received.

* * * * *